(12) United States Patent
Sun

(10) Patent No.: US 12,207,524 B2
(45) Date of Patent: Jan. 21, 2025

(54) DISPLAY PANEL AND DISPLAY APPARATUS

(71) Applicant: BOE Technology Group Co., Ltd., Beijing (CN)

(72) Inventor: Baofeng Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 185 days.

(21) Appl. No.: 17/912,733

(22) PCT Filed: Oct. 25, 2021

(86) PCT No.: PCT/CN2021/126040
§ 371 (c)(1),
(2) Date: Sep. 19, 2022

(87) PCT Pub. No.: WO2022/188418
PCT Pub. Date: Sep. 15, 2022

(65) Prior Publication Data
US 2023/0128097 A1   Apr. 27, 2023

(30) Foreign Application Priority Data
Mar. 12, 2021   (CN) .......................... 202110272303.9

(51) Int. Cl.
*H05K 5/02*    (2006.01)
*H10K 59/80*   (2023.01)
*H10K 102/00*  (2023.01)

(52) U.S. Cl.
CPC ....... *H10K 59/8721* (2023.02); *H05K 5/0247* (2013.01); *H10K 2102/311* (2023.02)

(58) Field of Classification Search
CPC .................................................. H05K 5/0247
See application file for complete search history.

(56) References Cited

U.S. PATENT DOCUMENTS 7,274,559 B2 * 9/2007 Kim ..................... H05K 5/0217
349/149
9,736,931 B2 * 8/2017 Eom ...................... H05K 1/028
(Continued)

FOREIGN PATENT DOCUMENTS

CN    105009188 A    10/2015
CN    106847871 A    6/2017
(Continued)

OTHER PUBLICATIONS

Office Action dated May 24, 2022, issued in counterpart CN application No. 202110272303.9, with English translation. (15 pages).

*Primary Examiner* — Mukundbhai G Patel
(74) *Attorney, Agent, or Firm* — WHDA, LLP

(57) ABSTRACT

The display panel includes an active area, a bending area, and a bonding area; the active area includes a substrate and a luminescent unit disposed on the substrate, the bending area includes a bending part, the bonding area includes a bonding part, the bending part is connected to the bonding part, and the bending part is configured for bending the bonding part on a side of the substrate away from the luminescent unit; the display panel further includes a protection part, the protection part is configured for at least covering the bending part, the protection part includes a first end and a second end opposite to each other, the first end is fixed to the side of the substrate away from the luminescent unit, and the second end is fixed to a side of the bending part away from the substrate.

15 Claims, 4 Drawing Sheets

(56) References Cited

U.S. PATENT DOCUMENTS

| | | | |
|---|---|---|---|
| 2012/0224117 A1* | 9/2012 | Miyazaki | G02F 1/13318 349/58 |
| 2014/0217382 A1 | 8/2014 | Kwon et al. | |
| 2014/0268595 A1 | 9/2014 | Eom et al. | |
| 2018/0019440 A1 | 1/2018 | Namkung | |
| 2018/0196300 A1 | 7/2018 | Jung et al. | |
| 2019/0036075 A1 | 1/2019 | Jiang | |
| 2019/0305234 A1 | 10/2019 | Jung | |
| 2021/0127513 A1 | 4/2021 | Sun et al. | |

FOREIGN PATENT DOCUMENTS

| | | |
|---|---|---|
| CN | 207082533 U | 3/2018 |
| CN | 107942563 A | 4/2018 |
| CN | 108305564 A | 7/2018 |
| CN | 108682307 A | 10/2018 |
| CN | 109658833 A | 4/2019 |
| CN | 109903681 A | 6/2019 |
| CN | 112164713 A | 1/2021 |
| CN | 212322555 U | 1/2021 |
| CN | 112435590 A | 3/2021 |
| CN | 113053246 A | 6/2021 |
| CN | 214587755 U | 11/2021 |
| EP | 3786695 A1 | 3/2021 |
| WO | 2018057652 A1 | 3/2018 |

\* cited by examiner

DISPLAY PANEL AND DISPLAY APPARATUS

CROSS-REFERENCE TO RELEVANT APPLICATIONS

The present disclosure claims the priority of the Chinese patent application filed on Mar. 12, 2021 before the CNIPA, China National Intellectual Property Administration with the application number of 202110272303.9 and the title of "DISPLAY PANEL AND DISPLAY APPARATUS", which is incorporated herein in its entirety by reference.

TECHNICAL FIELD

The present disclosure relates to the technical field of displaying and, more particularly, to a display panel and a display apparatus.

BACKGROUND

The flexible display screen is widely applied in mobile phones, computers, and other electronic devices due to its advantages of bendability, good flexibility, small volume, and light weight. The flexible display includes a flexible display panel, and the flexible display panel includes an active area and a bonding area (PAD area). In order to significantly reduce the frame, the bonding area is bent to the back of the flexible display panel. However, when the flexible display screen is folded, the flexible display panel will slide, so the bending part of the flexible display panel is easy to collide with the middle frame carrying the flexible display panel, which leads to an abnormal display.

SUMMARY

The embodiments of the present disclosure adopt the following technical solutions:

On one aspect, a display panel is provided, including an active area, a bending area located on a side of the active area, and a bonding area located on a side of the bending area away from the active area;

the active area includes a substrate and a luminescent unit disposed on the substrate, the bending area includes a bending part, the bonding area includes a bonding part, the bending part is connected to the bonding part, and the bending part is configured for bending the bonding part on a side of the substrate away from the luminescent unit;

the display panel further includes a protection part, the protection part is configured for at least covering the bending part, the protection part includes a first end and a second end opposite to each other, the first end is fixed to a side of the substrate away from the luminescent unit, and the second end is disposed on a side of the bending part away from the substrate.

Optionally, the protection part is further configured for covering the bonding part.

Optionally, the display panel further includes a chip part, the chip part is disposed on a side of the bonding part away from the substrate, and the bonding part is electrically connected to the chip part; and the protection part is further configured for covering the chip part.

Optionally, the display panel further includes a circuit board, the circuit board is disposed on a side of the substrate away from the luminescent unit; and the bonding part is electrically connected to the circuit board; and the protection part is further configured for covering the circuit board.

Optionally, a material of the protection part includes a metal or a metal alloy.

Optionally, the display panel further includes a chip part, the chip part is disposed on the side of the bonding part away from the substrate;

the protection part includes a first surface and a second surface opposite to each other, the first surface is farther from the substrate compared with the second surface;

wherein the first surface is substantially parallel to the substrate, and the second surface is not in contact with at least one of the bonding part, the chip part and the circuit board.

Optionally, a thickness of the protection part along a direction perpendicular to the substrate is uniform, and a distance from the second surface to the substrate is greater than a first distance, a value of the first distance is a maximum value of three distances, which are a maximum distance from the bonding part to the substrate along a direction perpendicular to the substrate, a maximum distance from the chip part to the substrate along a direction perpendicular to the substrate, and a maximum distance from the circuit board to the substrate along a direction perpendicular to the substrate.

Optionally, a thickness of the protection part along a direction perpendicular to the substrate is not uniform.

Optionally, the display panel further includes a plurality of studs, and the studs are fixed on the side of the substrate away from the luminescent unit; and the protection part includes a plurality of fastening threads, and the studs pass through the fastening threads; and the protection part is fixed on the side of the substrate away from the luminescent unit through the studs.

Optionally, a plurality of the studs are divided into two groups, one group is disposed in a peripheral area of the bonding part, and the other group is disposed on a side of the circuit board away from the bonding part.

Optionally, the display panel further includes a supporting sheet, the supporting sheet adheres to the side of the substrate away from the luminescent unit, and the bonding part, the chip part and the circuit board are disposed on a side of the supporting sheet away from the substrate.

On the other aspect, a display apparatus is provided, including the display panel as mentioned above.

Optionally, the display apparatus further includes a middle frame; the middle frame is disposed on a side of the protection part of the display panel away from the substrate of the display panel;

the middle frame includes an inner wall and a side wall connected to each other, and the inner wall is substantially parallel to and not in contact with the first surface of the protection part; and the display panel is configured for sliding relative to the side wall in a space limited by the middle frame.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the drawings that are required to describe the embodiments or the related art will be briefly introduced below. Apparently, the drawings that are described below are merely embodiments of the present disclosure, and a person skilled in the art may obtain other drawings according to these drawings without paying for creative work.

DETAILED DESCRIPTION OF THE EMBODIMENTS

The embodiments of the present disclosure are described below in further detail with reference to the drawings. Although the drawings show the embodiments of the present disclosure, it should be understood that the present disclosure may be exemplified in many various forms and should not be construed as being limited to the particular embodiments set forth herein. Rather, these embodiments are provided so that this application will be thorough and complete, and the scope of the present disclosure will be fully conveyed to those skilled in the art.

In the embodiments of the present disclosure, the words "first" and "second" are used to distinguish between identical or similar terms having essentially the same function and effect, In the embodiments of the present disclosure, the words "first" and "second" are used to distinguish between identical or similar items having essentially the same function and effect, merely for the purpose of clearly describing the technical solution of the present disclosure, and cannot be construed as indicating or implying relative importance or implicitly specifying the number of technical features indicated.

In the embodiments of the present disclosure, the meaning of "a plurality of" is two or more than two, unless there is a specific limitation otherwise.

Figure 1:
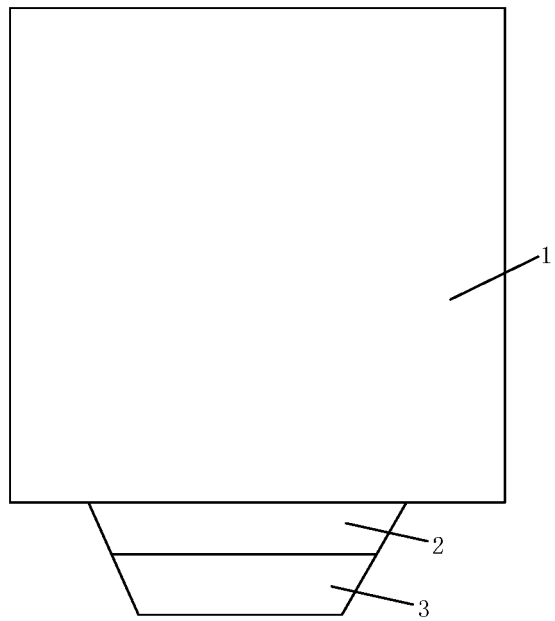
FIG. 1 is a structural schematic diagram of a display panel provided by an embodiment of the present disclosure.

A display panel is provided by an embodiment of the present disclosure, as referred to FIG. 1, including an active area 1, a bending area 2 located on a side of the active area 1, and a bonding area 3 located on a side of the bending area 2 away from the active area 1. As referred to FIG. 2, the active area includes a substrate 10 and a luminescent unit 11 disposed on the substrate 10, the bending area includes a bending part 21, the bonding area includes a bonding part 22, the bending part 21 is connected to the bonding part 22, and the bending part 21 is configured for bending the bonding part 22 on a side of the substrate 10 away from the luminescent unit 11.

The active area (AA) as mentioned above is used to realize the displaying, and the bonding area (PAD area) is used to bond the chip, a driving circuit, and other circuit structures. In order to greatly reduce a frame area, the bonding area of the display panel may be bent to a side of the substrate away from the luminescent unit. The specific structure of the luminescent unit as mentioned above is not limited herein, it needs to be determined according to the type of practical display panel. For example, the luminescent unit may include an organic electro-luminescent unit or a quantum dot luminescent unit and so forth.

The specific structures of the bending part and the bonding part as mentioned above are not limited, the structures may be selected according to the practical situation. The fixing method of the bonding part and the substrate is not limited. For example, the bonding part and a side of the substrate away from the luminescent unit may be fixed by using an adhesive.

The bonding area as mentioned above may include a first flexible base plate, and the bonding part may be disposed on the first flexible base plate. The first flexible base plate and the substrate of the active area may be an integrated structure or may be disposed separately, which is not limited herein. A material of the first flexible base plate may be a flexible material such as polyimide (PI) and so forth. Similarly, the bending area may further include a second flexible base plate, and the bending part may be disposed on the second flexible base plate. The second flexible base plate, the first flexible base plate, and the substrate of the active area may be an integrated structure or may be disposed separately, which is not limited herein. A material of the second flexible base plate may be a flexible material such as polyimide (PI) and so forth.

The display panel as mentioned above may be a flexible display panel (also referred as a flexible screen), which may be an Organic Light-Emitting Diode (OLED) display panel, and may also be a Micro LED micro-display panel or a Mini LED micro-display panel, and any other products or components with a displaying function including these display panels such as televisions, digital cameras, mobile phones, tablets and so forth.

Figure 2:
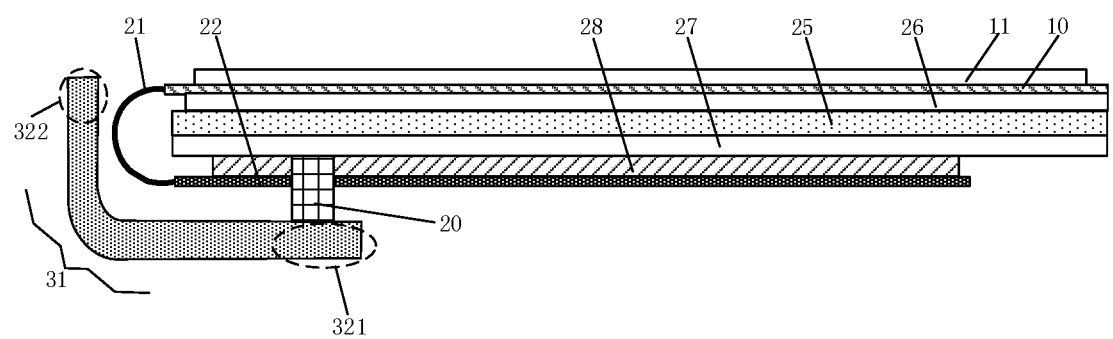
FIG. 2 to FIG. 5 are a plurality of local structural schematic diagrams of a display panel provided with a protection part provided by embodiments of the present disclosure.

As referred to FIG. 2, the display panel further includes a protection part 31, the protection part 31 is configured for at least covering the bending part 21, and the protection part 31 includes a first end 321 and a second end 322 opposite to each other, the first end 321 is fixed to the back of the substrate 10 and the second end 322 is disposed on a side of the bending part 21 away from the substrate 10.

Figure 3:
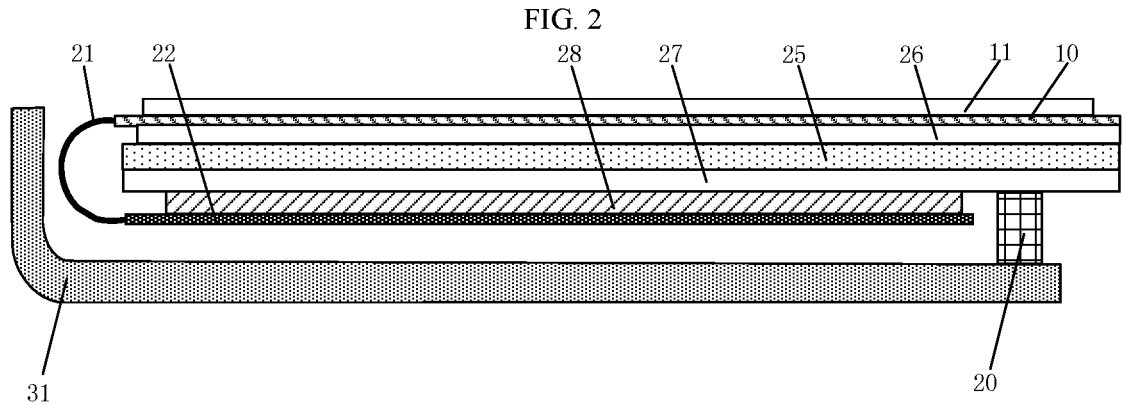

That the protection part as mentioned above at least covers the bending part includes: the protection part may only cover the bending part; or, as referred to FIG. 2, the protection part 31 covers the bending part 21 and a part of the bonding part 22; or, as referred to FIG. 3, the protection part 31 covers the bending part 21 and the entire bonding part 22, which is not limited herein.

The fixing method between the protection part and the substrate as mentioned above is not limited. For example, the protection part and the substrate may be fixed by bonding or by using the threads, and so forth. As referred to FIG. 2 and FIG. 3, the bonding part 31 and a side of the substrate 10 away from the luminescent unit 11 are fixed by using a fixed part 20. The specific shape of the protection part is not limited, as long as it is capable of meeting the requirements of at least covering the bending part.

A material of the protection part as mentioned above is not limited. In order to provide better protection, the protection part may be made of a material with a certain hardness, such as a metal or a metal alloy.

A display panel is provided by an embodiment of the present disclosure, which effectively protects the bending part of the bending area by arranging a protection part, and the support of the bending part is improved at the same time, thereby improving the performance and quality of the display panel.

In order to further protect the bonding part, as referred to FIG. 3, the protection part 31 is further configured for covering the bonding part 22.

Figure 4:
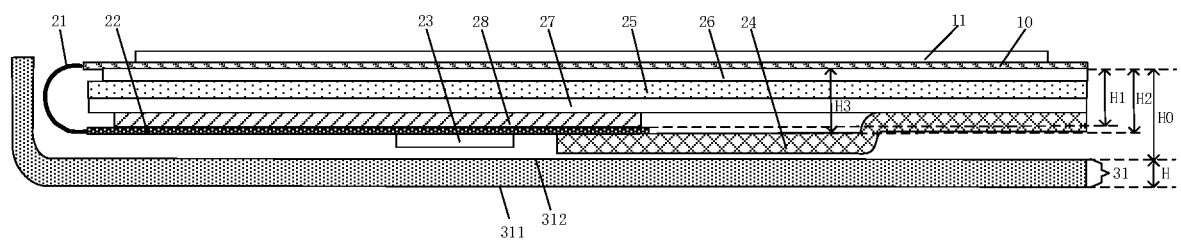

Optionally, as referred to FIG. 4, the display panel further includes a chip part 23, the chip part 23 is disposed on a side of the bonding part 22 away from the substrate 10, the bonding part 22 is electrically connected to the chip part 23, and the protection part 31 is further configured for covering the chip part 23.

The chip part as mentioned above may include a chip, and a type of the chip is not limited. For example, the chip may be an advanced reduced instruction set computing machines (Advanced RISC Machines, ARM) chip, a Digital Signal Processing (DSP) chip or a Field Programmable Gate Array (FPGA) chip and so forth. The chip may be disposed on a side of the bonding part away from the substrate by hot pressing.

While protecting the bonding part, the protection part may also be capable of protecting the chip part, thus providing strong support and protection. If the display panel is applied in a display apparatus with a touching function, the protection part is capable of providing enough support when a user touches and presses, so as to avoid damaging the bonding area and the chip part, thus improving the product quality and prolonging the service life. If the display panel is applied in a display apparatus with a folding function, due to displacement of the display panel may happen during folding or curling, the protection part is capable of avoiding a direct collision between the bending part of the bending area and a middle frame carrying the display panel, thereby improving the reliability of the display apparatus.

Optionally, as referred to FIG. 4, the display panel further includes a circuit board 24, and the circuit board 24 is disposed on a side of the substrate 10 away from the luminescent unit 11; the bonding part 22 is electrically connected to the circuit board 24, and the protection part 31 is further configured for covering the circuit board 24.

The circuit board as mentioned above may be a Flexible Printed Circuit (FPC), or other ordinary circuit board, which is not limited herein. The circuit board may be disposed on the side of the substrate away from the luminescent unit by hot pressing.

While protecting the bonding part, the protection part may also be capable of protecting the circuit board, thus providing strong support and protection. If the display panel is applied in a display apparatus with a touching function, the protection part is capable of providing enough support when a user touches and presses, so as to avoid damaging the bonding area and the circuit board, thus improving the product quality and prolonging the service life. If the display panel is applied in a display apparatus with a folding function, due to displacement of the display panel may happen during folding or curling, the protection part is capable of avoiding a direct collision between the bending part of the bending area and a middle frame carrying the display panel, thereby improving the reliability of the display apparatus.

Optionally, as referred to FIG. 4, the display panel further includes a chip part 23 and a circuit board 24, the chip part 23 is disposed on a side of the bonding part 22 away from the substrate 10, and the circuit board 24 is disposed on a side of the substrate 10 away from the luminescent unit 11; the bonding part 22 is electrically connected to the chip part 23 and the circuit board 24; and the protection part 31 is further configured for covering the chip part 23 and the circuit board 24.

The circuit board as mentioned above may be a Flexible Printed Circuit (FPC), or other ordinary circuit board, which is not limited herein. The circuit board may be disposed on a side of the substrate away from the luminescent unit by hot pressing.

The chip part as mentioned above may include a chip, and the chip type is not limited. For example, the chip may be an Advanced RISC Machines (ARM) chip, a Digital Signal Processing (DSP) chip or a Field Programmable Gate Array (FPGA) chip, and so forth. The chip may be disposed on a side of the bonding part away from the substrate by hot pressing.

While protecting the bonding part, the protection part may also be capable of protecting the chip part and the circuit board, thus providing strong support and protection. If the display panel is applied in a display apparatus with a touching function, the protection part is capable of providing enough support when a user touches and presses, so as to avoid damaging to the bonding area, the chip part and the circuit board, thus improving the product quality and prolonging the service life. If the display panel is applied in a display apparatus with a folding function, due to displacement of the display panel may happen during folding or curling, the protection part is capable of avoiding a direct collision between the bending part of the bending area and a middle frame carrying the display panel, thereby improving the reliability of the display apparatus.

In order to further improve the support strength, a material of the protection part may include a metal or a metal alloy. For example, the material of the protection part may be stainless steel, iron and so forth.

Optionally, as referred to FIG. 4 the display panel further includes the chip part 23 and the circuit board 24, the chip part 23 is disposed on a side of the bonding part 22 away from the substrate 10, and the circuit board 24 is disposed on a side of the substrate 10 away from the luminescent unit 11; the protection part 31 includes a first surface 311 and a second surface 312 opposite to each other, the first surface 311 is farther from the substrate 10 compared with the second surface 312; wherein the first surface 311 is substantially parallel to the substrate 10, and the second surface 312 is not in contact with at least one of the bonding part 22, the chip part 23 and the circuit board 24.

That the first surface as mentioned above is substantially parallel to the substrate includes: the first surface is parallel to the substrate; or, when the first surface is not parallel to the substrate, an angle value between the first surface and the substrate is an average value of a specific value within an acceptable deviation range, wherein the acceptable deviation range is determined by a measurement considered and being discussed by a person skilled in the art and an error (i.e. the limitation of a measurement system) associated with a measurement of a specific quantity.

That the second surface as mentioned above is not in contact with at least one of the bonding part, the chip part and the circuit board includes: the second surface is not in contact with any one of the bonding part, the chip part and the circuit board, respectively; or, the second surface is not in contact with any two of the bonding part, the chip part and the circuit board, respectively; or, the second surface is not in contact with the bonding part, the chip part and the circuit board, respectively. In FIG. 4, that the second surface 312 is not in contact with the bonding part 22, the chip part 23, and the circuit board 24 respectively is taken as an example to be painted.

The second surface of the protection part is not in contact with at least one of the bonding part, the chip part and the circuit board, respectively, so there may be a space between the second surface and at least one of the bonding part, the chip part and the circuit board, respectively, thereby greatly reducing the friction generated between the protection part and the bonding part, the chip part and the circuit board, respectively, and further protecting the bonding part, the chip part and the circuit board.

Generally, the bonding part may include a plurality of wirings and other structures, therefore, a distance from the bonding part to the substrate along a direction perpendicular to the substrate is not uniform. Similarly, a distance from the chip part to the substrate along a direction perpendicular to the substrate is not uniform, and a distance from the circuit board to the substrate along a direction perpendicular to the substrate is not uniform. In order to prevent the protection part from squeezing the bonding part, the chip part and the circuit board, optionally, as referred to FIG. 4, a thickness H of the protection part 31 along a direction perpendicular to the substrate is uniform, and a distance H0 from the second surface 312 to the substrate 10 is greater than a first distance. A value of the first distance is a maximum value of three distances, which are a maximum distance H1 from the bonding part 22 to the substrate 10 along a direction perpendicular to the substrate, a maximum distance H2 from the chip part 23 to the substrate 10 along a direction perpendicular to the substrate, and a maximum distance H3 from the circuit board 24 to the substrate 10 along a direction perpendicular to the substrate.

As referred to FIG. 4, the thickness H of the protection part 31 as mentioned above along the direction perpendicular to the substrate is uniform, and the first surface 311 is substantially parallel to the substrate 10, therefore, the second surface 312 of the protection part 31 may be substantially parallel to the first surface 311. The difficulty of producing the protection part is low and it is easy to implement.

Figure 5:
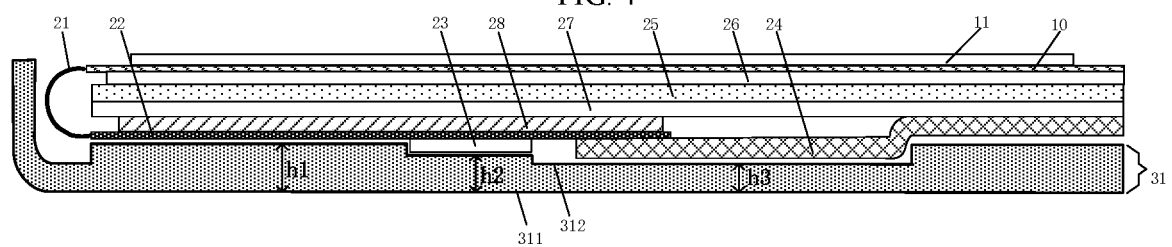

Optionally, as referred to FIG. 5, a thickness of the protection part 31 along a direction perpendicular to the substrate is not uniform; specific thicknesses of parts in the protection part corresponding to the bonding part, the chip part and the circuit board, respectively, are not limited, as long as it is capable to be guaranteed that the bonding part, the chip part and the circuit board are not squeezed by the protection part. For example, if the distance from the bonding part to the substrate along the direction perpendicular to the substrate is less than the distance from the circuit board to the substrate along the direction perpendicular to the substrate, as shown in FIG. 5, a thickness h1 of a part in the protection part 31 corresponding to the bonding part 22 may be greater than a thickness h3 of a part in the protection part 31 corresponding to the circuit board 24, which may increase a part of a thickness of the protection part in an existing design space, to further improve the support of the protection part. In FIG. 5, that the thickness h0 of the part in the protection part 31 corresponding to the bonding part 22, the thickness h2 of the part in the protection part 31 corresponding to the chip part 23 and the thickness h3 of the part in the protection part 31 corresponding to the circuit board 24 are decreasing in turn is taken as an example to be painted.

Figure 6:
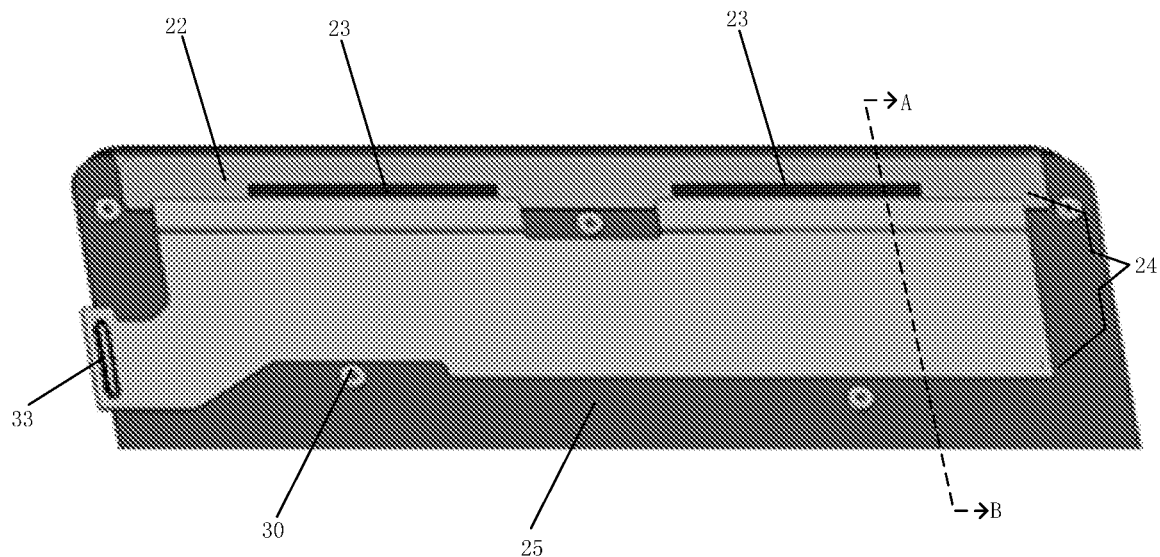
FIG. 6 is a local structural schematic diagram of a display panel provided with studs provided by an embodiment of the present disclosure.

In order to better fix the protection part, optionally, the display panel further includes a plurality of studs 30 as shown in FIG. 6, and the studs are fixed on a side of the substrate away from the luminescent unit. Combining FIG. 7 and FIG. 8, the protection part 31 includes a plurality of fastening threads 32, and the studs pass through the fastening threads to obtain the structural diagram shown in FIG. 9; the protection part is fixed on a side of the substrate away from the luminescent unit by the studs.

Figure 7:
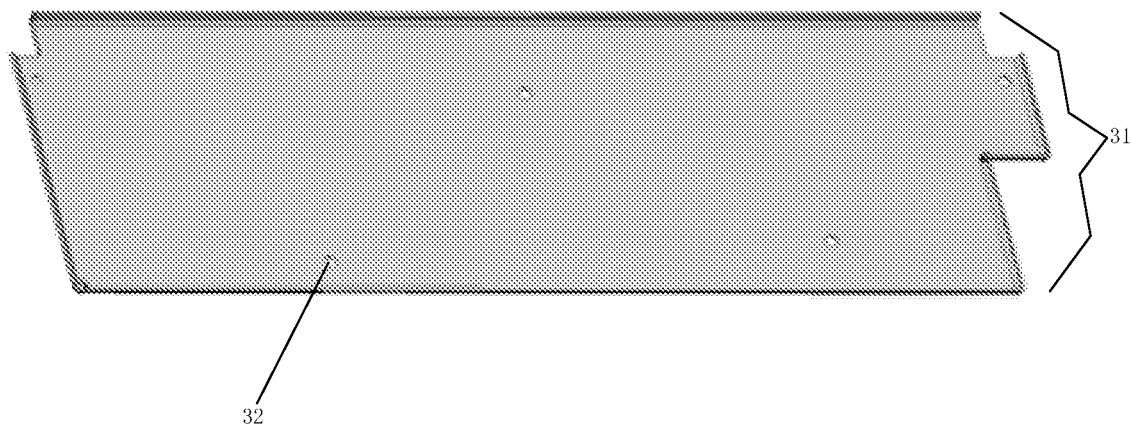
FIG. 7 to FIG. 8 are two structural schematic diagrams of the protection part provided by embodiments of the present disclosure.
Figure 8:
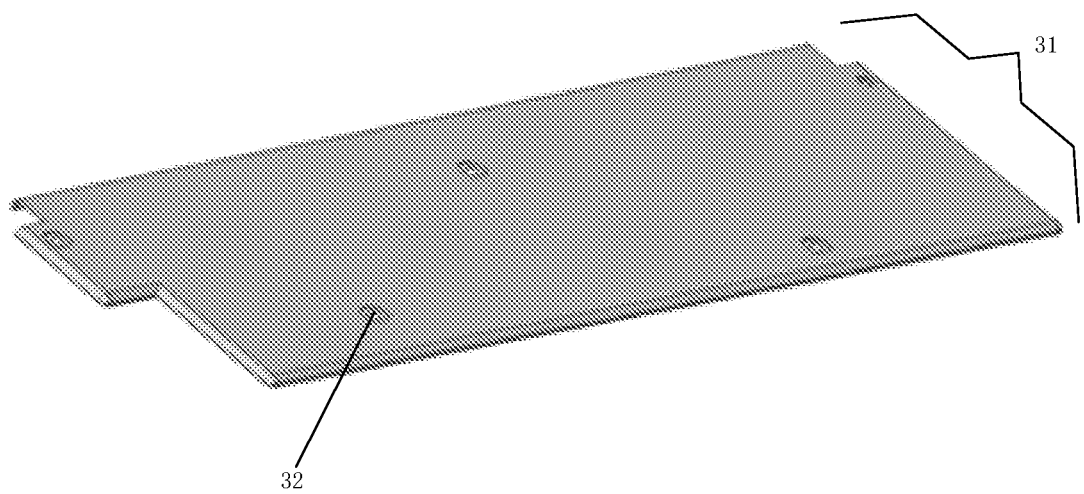
Figure 9:
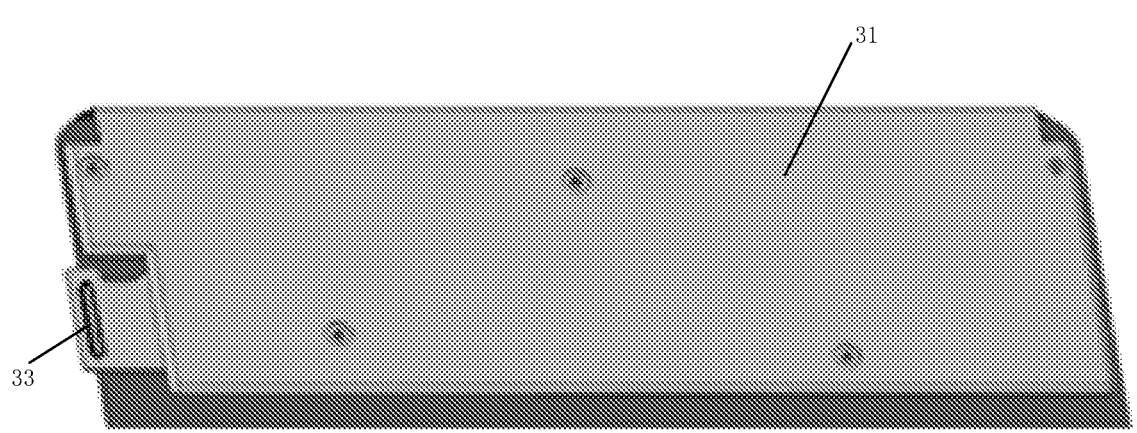
FIG. 9 is a local structural schematic diagram of the display panel after fixing the protection part on a structure of FIG. 6.

The specific location and quantity of the plurality of the studs as mentioned above are not limited. In order to protect the bonding part, the chip part and the circuit board, as referred to FIG. 6, the plurality of the studs 30 may be disposed as avoiding the bonding part, the chip part and the circuit board. FIG. 6 is painted with five studs being taken as an example. FIG. 4 and FIG. 5 may be two cross-sectional diagrams along the AB direction in FIG. 6. FIG. 7 and FIG. 8 are painted with five fastening threads being taken as an example. FIG. 7 and FIG. 8 are structural diagrams of both sides of the protection part 31, respectively.

Optionally, a plurality of the studs are divided into two groups, one group is disposed in a peripheral area of the bonding part, and the other group is disposed on a side of the circuit board away from the bonding part. As referred to FIG. 6, a stud 30 is disposed on the left, middle, and right of the bonding part 22, respectively, and at a same time, two studs 30 are disposed on a side of the circuit board 24 away from the bonding part 22 to ensure the stable support of the protection part.

Optionally, as referred to FIG. 2 to FIG. 6, the display panel further includes a supporting sheet 25, the supporting sheet 25 adheres to a side of the substrate 10 away from the luminescent unit 11, and the bonding part 22, the chip part 23 and the circuit board 24 are disposed on a side of the supporting sheet 25 away from the substrate 10.

A material of the supporting sheet as mentioned above is not limited. For example, the supporting sheet may be a steel sheet with strong support. As referred to FIG. 2 to FIG. 5, the supporting sheet 25 may adhere to the substrate 10 through a first adhesive layer 26, the first adhesive layer may be made of a flexible glue with smaller hardness. In order to facilitate producing the bonding part, the chip part and the circuit board afterward, the display panel may further include a second adhesive layer 27 and an adhesive part 28. The second adhesive layer 27 is disposed on a side of the supporting sheet 25 away from the substrate 10 and adhered to the supporting sheet 25. A hardness of the second adhesive layer is greater than a hardness of the first adhesive layer. The adhesive part 28 is disposed on a side of the second adhesive layer 27 away from the supporting sheet 25, and is corresponded to the position of the bonding part 22, and is configured for adhering the bonding part 22. As referred to FIG. 4 and FIG. 5, the chip part 23 may be disposed on a side of the bonding part 22 away from the supporting sheet 25 by hot pressing. The circuit board 24 may be disposed on a side of the second adhesive layer 27 away from the supporting sheet 25 by hot pressing. The chip part 23 and the circuit board 24 is electrically connected to the bonding part 22, respectively. As referred to FIG. 6, a plurality of the studs 30 may be bonded on the supporting sheet 25 by a hot-melting-adhesive process.

As referred to FIG. 6, the display panel may further include a connector 33, the connector 33 is electrically connected to the circuit board 24, the circuit board may be connected to a front main board through the connector to obtain data signals and so forth, the front main board may include a TCON board and so forth.

A display apparatus is provided by an embodiment of the present disclosure, which includes the display panel as mentioned above. The display apparatus may be a display apparatus provided with a touching function, or, it may be a display apparatus provided with a folding or curling function, or, it may be a display apparatus provided with both a touching function and folding function, which is not limited herein. The display apparatus may be an Organic Light-Emitting Diode (OLED) display apparatus, it may also be a Micro LED micro-display apparatus or a Mini LED micro-display apparatus, and any product or component with a displaying function including the display apparatus such as televisions, digital cameras, mobile phones, tablets and so forth.

Figure 10:
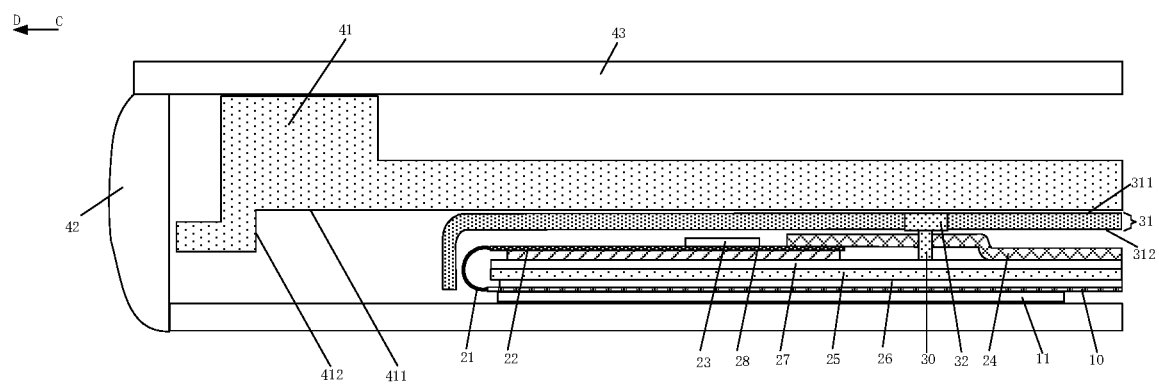
FIG. 10 is a local schematic structural diagram of a display apparatus provided by an embodiment of the present disclosure.

Optionally, as referred to FIG. 10, the display apparatus further includes a middle frame 41, and the middle frame 41 is disposed on a side of the protection part 31 of the display panel away from the substrate 10 of the display panel. The middle frame 41 includes an inner wall 411 and a side wall 412 connected to each other, and the inner wall 411 is substantially parallel to and not in contact with the first surface 311 of the protection part 31, and the display panel is configured for sliding relative to the side wall 412 in a space limited by the middle frame.

That the inner wall as mentioned above is substantially parallel to the first surface of the protection part includes: the inner wall is parallel to the first surface of the protection part; or, when the first surface of the protection part is not parallel to the inner wall, an angle value between the first surface and the inner wall is an average value of a specific value within an acceptable deviation range, wherein the acceptable deviation range is determined by a measurement considered and being discussed by a person skilled in the art and an error (i.e. the limitation of a measurement system) associated with a measurement of a specific quantity.

A gap may be disposed between the inner wall of the middle frame as mentioned above and the first surface of the protection part, to facilitate the sliding of the display panel. The gap may be filled with gas, and the gas may be air, or it may also be hydrogen, oxygen, and so forth, which is not limited herein. A thickness of the gap along a direction perpendicular to the first surface is not limited. For example, the thickness of the gap along the direction perpendicular to the first surface may be 0.1 mm.

It should be noted that if the protection part includes a first protection part, then there is no need for the middle frame as mentioned above to avoid the chip part and the circuit board, thereby further improving the support protection of the middle frame.

During a process of that the display panel is folded or curled, as referred to FIG. 10, the display panel may slide along the CD direction relative to the side wall 412 in a space limited by the middle frame 41, the protection part 31 of the display panel may be capable of avoiding a direct collision between the bending part 21 of the bending area and the side wall 412 of the middle frame 41, thus improving the reliability of the display apparatus.

Certainly, as referred to FIG. 10, the display apparatus may further include a whole machine front frame 42, a whole machine housing 43, and other structures, for better packaged.

Many details are discussed in the specification provided herein. However, it should be understood that the embodiments of the disclosure can be implemented without these specific details. In some examples, the well-known methods, structures, and technologies are not shown in detail so as to avoid an unclear understanding of the description.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A display panel, wherein the display panel comprises an active area, a bending area located on a side of the active area, and a bonding area located on a side of the bending area away from the active area;

the active area comprises a substrate and a luminescent unit disposed on the substrate, the bending area comprises a bending part, the bonding area comprises a bonding part, the bending part is connected to the bonding part, and the bending part is configured for bending the bonding part on a side of the substrate away from the luminescent unit;

the display panel further comprises a protection part, the protection part is configured for at least covering the bending part, the protection part comprises a first end and a second end opposite to each other, the first end is fixed to the side of the substrate away from the luminescent unit, and the second end is disposed on a side of the bending part away from the substrate;

the display panel further comprises a circuit board, the circuit board is disposed on a side of the substrate away from the luminescent unit; the bonding part is electrically connected to the circuit board; and the protection part is further configured for covering the circuit board;

the display panel further comprises a plurality of studs, and the studs are fixed on the side of the substrate away from the luminescent unit;

the protection part comprises a plurality of fastening threads, and the studs pass through the fastening threads;

the protection part is fixed on the side of the substrate away from the luminescent unit through the studs; and the plurality of the studs are divided into two groups, one group is disposed in a peripheral area of the bonding part, and the other group is disposed on a side of the circuit board away from the bonding part.

2. The display panel according to claim 1, wherein, the protection part is further configured for covering the bonding part.

3. The display panel according to claim 1, wherein, the display panel further comprises a chip part, the chip part is disposed on a side of the bonding part away from the substrate, and the bonding part is electrically connected to the chip part; and the protection part is further configured for covering the chip part.

4. The display panel according to claim 1, wherein, a material of the protection part comprises a metal or a metal alloy.

5. The display panel according to claim 1, wherein, the display panel further comprises a chip part, the chip part is disposed on the side of the bonding part away from the substrate;

the protection part comprises a first surface and a second surface opposite to each other, the first surface is farther from the substrate compared with the second surface;

wherein the first surface is substantially parallel to the substrate, and the second surface is not in contact with at least one of the bonding part, the chip part and the circuit board.

6. The display panel according to claim 5, wherein, a thickness of the protection part along a direction perpendicular to the substrate is uniform, and a distance from the second surface to the substrate is greater than a first distance, a value of the first distance is a maximum value of three distances, which are a maximum distance from the bonding part to the substrate along a direction perpendicular to the substrate, a maximum distance from the chip part to the substrate along a direction perpendicular to the substrate, and a maximum distance from the circuit board to the substrate along a direction perpendicular to the substrate.

7. The display panel according to claim 5, wherein, a thickness of the protection part along a direction perpendicular to the substrate is not uniform.

8. The display panel according to claim 5, wherein, the display panel further comprises a supporting sheet, the supporting sheet adheres to the side of the substrate away from the luminescent unit, and the bonding part, the chip part and the circuit board are disposed on a side of the supporting sheet away from the substrate.

9. A display apparatus comprising the display panel according to claim 1.

10. A display apparatus comprising:
a display panel, wherein the display panel comprises an active area, a bending area located on a side of the active area, and a bonding area located on a side of the bending area away from the active area; the active area comprises a substrate and a luminescent unit disposed on the substrate, the bending area comprises a bending part, the bonding area comprises a bonding part, the bending part is connected to the bonding part, and the bending part is configured for bending the bonding part on a side of the substrate away from the luminescent unit; and the display panel further comprises a protection part, the protection part is configured for at least covering the bending part, the protection part comprises a first end and a second end opposite to each other, the first end is fixed to the side of the substrate away from the luminescent unit, and the second end is disposed on a side of the bending part away from the substrate; and a middle frame, wherein the middle frame is disposed on a side of the protection part of the display panel away from the substrate of the display panel; the middle frame comprises an inner wall and a side wall connected to each other, and the inner wall is substantially parallel to and is not in contact with the first surface of the protection part; and the display panel is configured for sliding relative to the side wall in a space limited by the middle frame.

11. The display apparatus according to claim 10, wherein, the protection part is further configured for covering the bonding part.

12. The display apparatus according to claim 10, wherein, the display panel further comprises a chip part, the chip part is disposed on a side of the bonding part away from the substrate, and the bonding part is electrically connected to the chip part; and the protection part is further configured for covering the chip part.

13. The display apparatus according to claim 10, wherein, the display panel further comprises a circuit board, the circuit board is disposed on a side of the substrate away from the luminescent unit;

the bonding part is electrically connected to the circuit board; and the protection part is further configured for covering the circuit board.

14. The display apparatus according to claim 13, wherein, the display panel further comprises a chip part, the chip part is disposed on the side of the bonding part away from the substrate;

the protection part comprises a first surface and a second surface opposite to each other, the first surface is farther from the substrate compared with the second surface;

wherein the first surface is substantially parallel to the substrate, and the second surface is not in contact with at least one of the bonding part, the chip part and the circuit board.

15. The display apparatus according to claim 10, wherein, a material of the protection part comprises a metal or a metal alloy.

* * * * *